United States Patent
Byun et al.

(10) Patent No.: US 11,758,650 B2
(45) Date of Patent: Sep. 12, 2023

(54) FLEXIBLE PRINTED CIRCUIT BOARD AND ELECTRONIC DEVICE INCLUDING THE SAME

(71) Applicant: SAMSUNG ELECTRO-MECHANICS CO., LTD., Suwon-si (KR)

(72) Inventors: Dae Jung Byun, Suwon-si (KR); Jung Soo Kim, Suwon-si (KR); Sang Hyun Sim, Suwon-si (KR); Chang Min Ha, Suwon-si (KR); Jin Won Lee, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 140 days.

(21) Appl. No.: 17/246,271

(22) Filed: Apr. 30, 2021

(65) Prior Publication Data
US 2022/0167496 A1    May 26, 2022

(30) Foreign Application Priority Data
Nov. 25, 2020   (KR) .................. 10-2020-0160268

(51) Int. Cl.
*H05K 1/18*   (2006.01)
*H05K 1/02*   (2006.01)
*G06F 1/16*   (2006.01)

(52) U.S. Cl.
CPC ......... *H05K 1/0281* (2013.01); *G06F 1/1652* (2013.01); *H05K 1/189* (2013.01); *H05K 2201/10128* (2013.01)

(58) Field of Classification Search
CPC ...... H05K 1/118; H05K 1/189; H05K 1/0281; H05K 1/02; H05K 1/0296; H05K 1/028; H05K 1/0265; H05K 2201/09736; H05K 2201/09745; H05K 2201/09681; H05K 2201/0969; H05K 2201/10128; H05K 2201/051; H05K 3/4691; H05K 3/281; G06F 1/1652
See application file for complete search history.

(56) References Cited

U.S. PATENT DOCUMENTS

| | | | | |
|---|---|---|---|---|
| 5,499,444 A | * | 3/1996 | Doane, Jr | H05K 3/4691 |
| | | | | 29/760 |
| 2007/0202307 A1 | * | 8/2007 | Oh | H05K 3/4691 |
| | | | | 428/209 |
| 2010/0051325 A1 | * | 3/2010 | Sato | H05K 3/4652 |
| | | | | 174/254 |
| 2011/0199739 A1 | * | 8/2011 | Naganuma | H05K 3/4691 |
| | | | | 29/829 |
| 2012/0186860 A1 | * | 7/2012 | Takaoka | H05K 1/028 |
| | | | | 174/254 |

(Continued)

FOREIGN PATENT DOCUMENTS

KR    10-1931338 B1    12/2018

*Primary Examiner* — Roshn K Varghese
(74) *Attorney, Agent, or Firm* — Morgan, Lewis & Bockius LLP

(57) ABSTRACT

A flexible printed circuit board includes a base film; a circuit pattern disposed on one surface of the base film; and a coverlay film covering the circuit pattern. The base film is divided into a flexible area and a rigid area, and the circuit pattern of the flexible area comprises a portion thinner than a portion of the circuit pattern of the rigid area.

20 Claims, 6 Drawing Sheets

(56) References Cited

U.S. PATENT DOCUMENTS

2017/0374740 A1* 12/2017 Yamaguchi .......... H05K 3/4691
2018/0042099 A1*  2/2018 Sebanz ................ H05K 1/02
2020/0389972 A1* 12/2020 Yu ...................... H05K 1/0393
2021/0219425 A1*  7/2021 Oka .................... H05K 3/40

* cited by examiner

FLEXIBLE PRINTED CIRCUIT BOARD AND ELECTRONIC DEVICE INCLUDING THE SAME

CROSS-REFERENCE TO RELATED APPLICATION(S)

The present application claims the benefit of priority to Korean Patent Application No. 10-2020-0160268, filed on Nov. 25, 2020 in the Korean Intellectual Property Office, the disclosure of which is incorporated herein by reference in its entirety.

TECHNICAL FIELD

The present disclosure relates to a flexible printed circuit board and an electronic device including the same.

BACKGROUND

Recently, as electronic devices such as foldable mobile phones and tablets have appeared, there is a need for a flexible printed circuit board having sufficient flexibility to be bendable and/or foldable.

In order to implement an electronic device including a flexible display capable of being bent, folded, or the like, hundreds of thousands of times, the flexible printed circuit board is required to not only be thin and light but also durable. In a situation in which internal components constituting the flexible printed circuit board are thin, there is a need for a technology for repeatedly and continuously distributing external forces applied to a conductive line of the flexible printed circuit board.

SUMMARY

An aspect of the present disclosure may provide a flexible printed circuit board capable of securing reliability in bending and folding even in the case that repeated external forces are applied to the flexible printed circuit board in a situation in which thin and light conductive wires are used.

Another aspect of the present disclosure may provide a flexible printed circuit board simultaneously having improved wiring reliability and improved folding reliability by forming a conductive pattern in a flexible area to have a different thickness from that in a rigid area in the flexible printed circuit board.

Another aspect of the present disclosure may provide a flexible electronic device having improved durability due to folding.

According to an aspect of the present disclosure, a flexible printed circuit board may include: a base film; a circuit pattern disposed on one surface of the base film; and a coverlay film covering the circuit pattern, wherein the base film is divided into a flexible area and a rigid area, and the circuit pattern of the flexible area comprises a portion thinner than a portion of the circuit pattern of the rigid area.

According to another aspect of the present disclosure, a flexible printed circuit board may include: a rigid area comprising a first base film and a first circuit pattern disposed on the first base film; a flexible area comprising a second base film, which is bendable, and a circuit pattern disposed on one outer surface of the second base film; and a coverlay film covering the first and second circuit patterns of the rigid area and the flexible area, wherein the second circuit pattern of the flexible area has a portion thinner than a portion of the first circuit pattern of the rigid area.

According to another aspect of the present disclosure, an electronic device may include: a flexible printed circuit board comprising a flexible area and at least one of a first rigid area or a second rigid area connected to the flexible area; and a display module electrically connected to at least one of the first rigid area or the second rigid area, wherein the flexible printed circuit board includes a base film; a circuit pattern disposed on one upper surface of the base film; and a coverlay film covering the circuit pattern, wherein the base film is divided into the flexible area and the at least one of the first rigid area or the second rigid area, and the circuit pattern of the flexible area comprises a portion thinner than a portion of the circuit pattern of the at least one of the first rigid area or the second rigid area.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
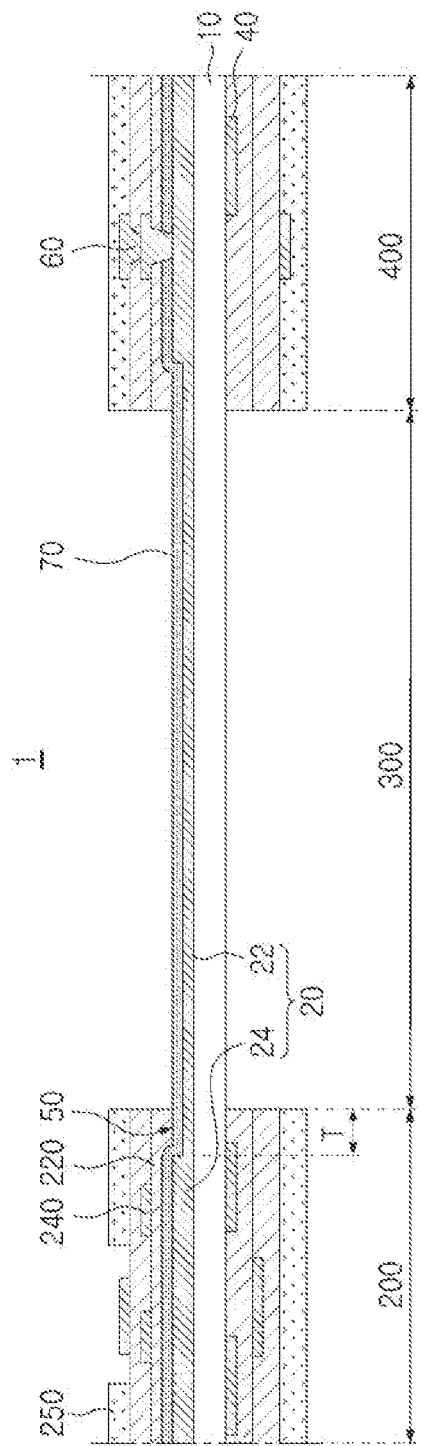
FIG. 1 is a cross-sectional view schematically illustrating a flexible printed circuit board according to an exemplary embodiment in the present disclosure.

Hereinafter, exemplary embodiments of the present disclosure will now be described in detail with reference to the accompanying drawings.

The exemplary embodiments are subject to various modifications and are provided to assist those skilled in the art in gaining a completely comprehensive understanding. Accordingly, shapes and sizes of elements in the drawings may be exaggerated for clarity, and elements indicated by the same reference numerals in the drawings refer to the same elements.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there may be no other elements intervening therebetween.

Although terms such as "first" and "second" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for simply describing various examples only, and is not to be used to limit the disclosure. In this case, expressions in the singular include plural expressions unless otherwise indicated.

Flexible Printed Circuit Board

FIG. 1 is a cross-sectional view schematically illustrating a flexible printed circuit board according to an exemplary embodiment in the present disclosure.

Referring to FIG. 1, the flexible printed circuit board 1 according to an exemplary embodiment of the present disclosure may include a base film 10, a circuit pattern 20 and a coverlay film 70.

The base film 10 may contain a polyimide (PI) resin having excellent heat resistance, and the material of the base film 10 is not particularly limited as long as it is a heat-resistant insulating coating resin such as polyethylene terephthalate (PET). In addition, a liquid crystal polymer (LCP) may be used as the base film 10 for improving flexible characteristics such as bending, folding, or the like.

The circuit pattern 20 may include a copper foil on one surface of the base film 10 to form a wire through which an electric signal is transferred. As for the circuit pattern 20, a rolled annealed (RA) copper foil may be used as a copper foil for signal transfer, particularly for a reduced thickness. If necessary, however, an electrodeposited (ED) copper foil may be used, and a method of forming the copper foil is not particularly limited.

The base film 10, a first circuit pattern 20 and a second circuit pattern 40 may constitute a flexible copper clad laminate (FCCL) film which is bendable or foldable. The flexible printed circuit board 1 manufactured of such a flexible copper clad laminate film may be applied to a microelectronic device such as a camera of a mobile communication terminal or a next-generation electronic device such as a laptop PC or a foldable terminal.

The flexible printed circuit board 1 of present exemplary embodiment is divided into a flexible area 300 and rigid areas 200 and 400, and the second circuit pattern 40 is not disposed on the opposite surface of the base film 10 of the flexible area 300 on which the circuit pattern 20 is formed. That is, the flexible area 300 is a single-sided flexible printed circuit board (FPC), while the rigid areas 200 and 400 are double-sided FPC. Such configuration may allow reliability of folding to be secured in the flexible area 300 in which bending or folding is performed and reliability of wiring to be secured in the rigid area in which an electrical signal is exchanged with external electronic modules.

Meanwhile, the FCCL film may constitute a flexible area 300 of the flexible printed circuit board 1 according to the present exemplary embodiment, and the rigid areas 200 and 400 may be formed by building up an insulating layer 220 and a wiring layer 240 on the FCCL film. The rigid areas 200 and 400 may be formed at both ends of the flexible area 300 and may constitute a first rigid area 200 and a second rigid area 400, respectively. If required by an electronic device, the rigid areas 200 and 400 may not be included in the flexible printed circuit board 1, or only one of the first rigid area 200 and the second rigid area 400 may be formed in the flexible printed circuit board 1.

Each of the first rigid area 200 and the second rigid area 400 is for relatively describing an area which is more difficult to bend or fold than the flexible area 300. It should be understood that the first rigid area 200 and the second rigid area 400 are not to be interpreted as being areas which are not bendable or foldable.

A rigid-flexible printed circuit board including the first rigid area 200, the second rigid area 400 and the flexible area 300 is an example of the flexible printed circuit board 1 according to the present disclosure.

The first rigid area 200 and the second rigid area 400 are multilayer circuit boards in which the insulating layers 220 and the wiring layers 240 are built up on the flexible copper clad laminate film, and the number of layers may be selected as needed. A method of forming the rigid areas is not limited thereto.

The coverlay film 70 is a sheet used as a solder resist of the flexible printed circuit board 1 and may be connected to the first circuit pattern 20 by an adhesive. At this time, prepreg obtained by impregnating a thermosetting resin in a base material such as glass fiber and curing the same to a B-stage (a semi-cured state of the resin) may be used as the adhesive; however, the material of the adhesive is not limited thereto.

Meanwhile, the circuit pattern 22 of the flexible area 300 has a portion thinner than the circuit pattern 24 of the rigid area 200. Hereinbelow, an exemplary embodiment for each circuit pattern will be described in detail.

Figure 2:
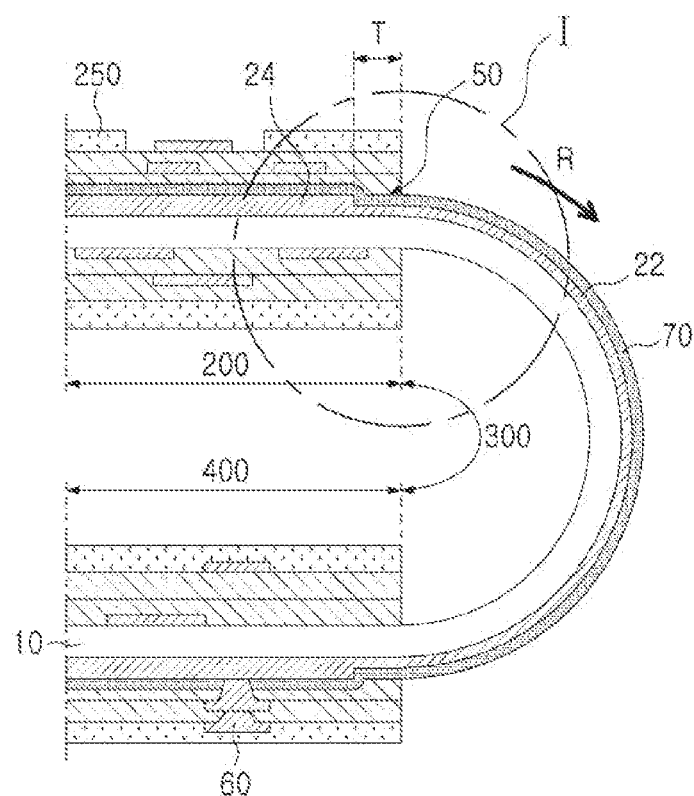
FIG. 2 is a cross-sectional view of a circuit pattern of Example 1 of the flexible printed circuit board of FIG. 1.
Figure 3:
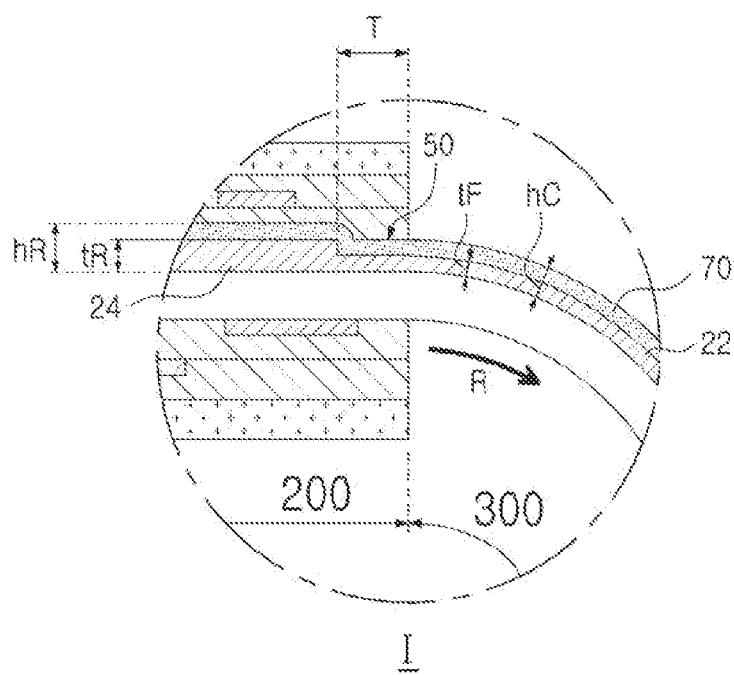
FIG. 3 is an enlarged schematic view illustrating portion I of FIG. 2.

FIG. 2 is a cross-sectional view of a circuit pattern of Example 1 of the flexible printed circuit board of FIG. 1, and FIG. 3 is an enlarged schematic view illustrating portion I of FIG. 2.

Referring to FIGS. 1 to 3, the flexible printed circuit board 1 includes the first rigid area 200 and the flexible area 300, and the circuit pattern 22 of the flexible area 300 has a portion thinner than the circuit pattern 24 of the rigid area 200.

In the present exemplary embodiment, a thickness tF of the circuit pattern 22 of the flexible area 300 is overall formed to be uniformly small, as compared to a thickness tR of the circuit pattern 24 of the rigid area 200.

When bending or folding the flexible printed circuit board 1, compressive force is generated inwardly within the bended portion of the flexible printed circuit board 1, while tensile force is generated outwardly within the bend. When the thickness of the circuit pattern 22 of the flexible area 300 is uniform overall as compared to the circuit pattern 24 of the rigid area 200, it may be possible to reduce the tensile force generated outwardly within the bend. As used herein, the term "bending" may be defined as a partially folded state. Upon bending, a curvature R begins to be formed in the flexible area 300 of the flexible printed circuit board 1.

The coverlay film 70 maintains substantially the same thickness in the rigid areas 200 and 400 and the flexible area 300, such that a height hC of the coverlay film of the flexible area 300 is smaller than a height hR of the coverlay film of the rigid area 200, thereby aiding to distribute the tensile force applied outwardly within the bend.

Further, the rigid area 200 includes a transition region T, in which the circuit pattern 22 of the flexible area 300 is connected to the circuit pattern 24 of the rigid area 200, and a margin portion 50 having substantially the same thickness as the circuit pattern 22 of the flexible area 300 is provided in the transition region T. One or ordinary skill in the art would understand that the expression "substantially the same" refers to being the same by allowing process errors, positional deviations, and/or measurement errors that may occur in a manufacturing process.

As the circuit pattern 22 of the flexible area 300, a circuit pattern 22 of the margin portion is uniformly formed to be thinner overall than the circuit pattern 24 in the rigid area 200.

In the margin portion 50, an end of the margin portion 50 is a boundary between the circuit pattern 24 of the rigid area 200 and the circuit pattern 22 of the flexible area 300 and corresponds to a manufacturing error. By allowing the margin portion 50 to have an allowable length, bending of the circuit pattern 22 of the flexible area 300 may be relatively easily initiated at the end of the margin portion 50.

Figure 4:
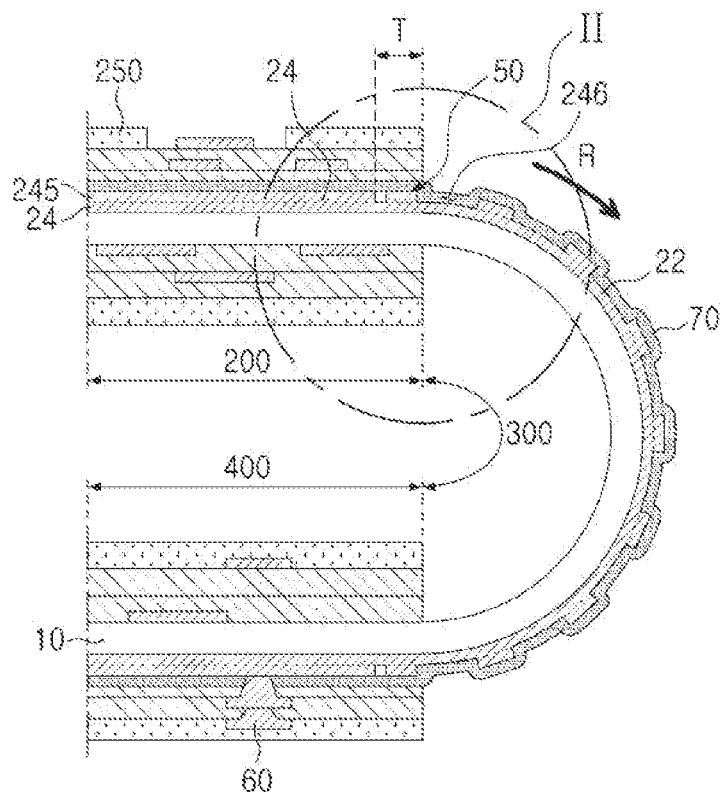
FIG. 4 is a cross-sectional view of a circuit pattern of Example 2 of the flexible printed circuit board of FIG. 1.
Figure 5:
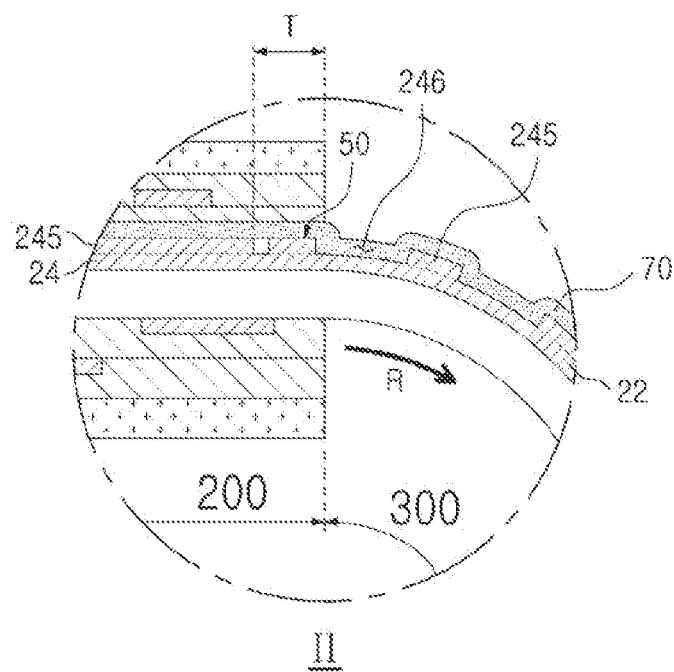
FIG. 5 is an enlarged schematic view illustrating portion II of FIG. 4.

FIG. 4 is a cross-sectional view of a circuit pattern of Example 2 of the flexible printed circuit board of FIG. 1, and FIG. 5 is an enlarged schematic view illustrating portion II of FIG. 4.

Referring to FIGS. 1, 4 and 5, the flexible printed circuit board 1 includes the first rigid area 200 and the flexible area 300, and the circuit pattern 22 of the flexible area 300 has a portion thinner than the circuit pattern 24 of the rigid area 200.

The portion in the circuit pattern 22 of the flexible area, thinner than the circuit pattern 24 of the rigid area 200, is a square groove 246 formed in the circuit pattern 22 of the flexible area 300.

As compared to the circuit pattern 22 of the flexible area 300 of FIGS. 2 and 3, a thickness-reinforcing circuit pattern 245 is formed in an upper portion of the circuit pattern 22 of the flexible area 300 of the present exemplary embodiment such that an overall thickness of the circuit pattern in the flexible area 300 becomes similar to that of the circuit pattern 24 of the rigid area 200.

The thickness-reinforcing circuit pattern 245 of the flexible area 300 may be manufactured by selecting a rolled annealed copper foil relatively thicker than the circuit pattern 22 of the flexible area 300 of FIGS. 2 and 3 and etching to form the square grooves 246 at regular intervals.

When bending or folding the flexible printed circuit board 1, compressive force is generated inwardly within the bended portion of the flexible printed circuit board 1, and tensile force is generated outwardly within the bended portion. A thickness difference at a stepped portion formed in the circuit pattern 22 of the flexible area 300 due to the square groove 246 may reduce the tensile force generated outwardly within the bended portion.

Alternately, the thickness may be increased by selecting a rolled annealed copper foil having a thickness not different from that of the circuit pattern 22 of the flexible area 300 of FIGS. 2 and 3 and forming the thickness-reinforcing circuit pattern 245 thicker than the circuit pattern 22 of the flexible area 300 on an upper portion of the rolled annealed copper foil to form an electrodeposited copper foil.

The thickness-reinforcing circuit pattern 245 of the flexible area 300 having the square groove 246 may effectively reduce the tensile force generated outwardly within the bended portion by having a smaller average thickness than that of the thickness-reinforcing circuit pattern 245 of the rigid area 200. In addition, the coverlay film 70 of the flexible area 300 may be disposed at a lower level than the coverlay film 70 of the rigid area 200 according to the square groove 246 of the thickness-reinforcing circuit pattern 245.

Such a lamination method can be applied to the method of forming the circuit pattern 24 of the rigid area 200 of the exemplary embodiments of FIGS. 1 to 3. The descriptions of the exemplary embodiments of FIGS. 1 to 3 may also be applied to the present exemplary embodiment within a range which does not contradict each other.

Figure 6:
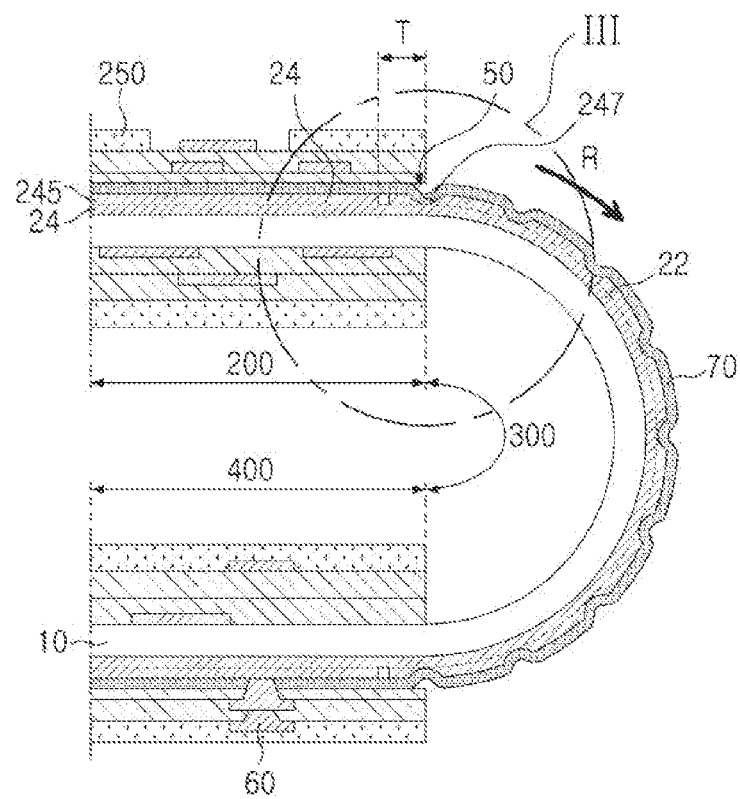
FIG. 6 is a cross-sectional view of a circuit pattern of Example 3 of the flexible printed circuit board of FIG. 1.
Figure 7:
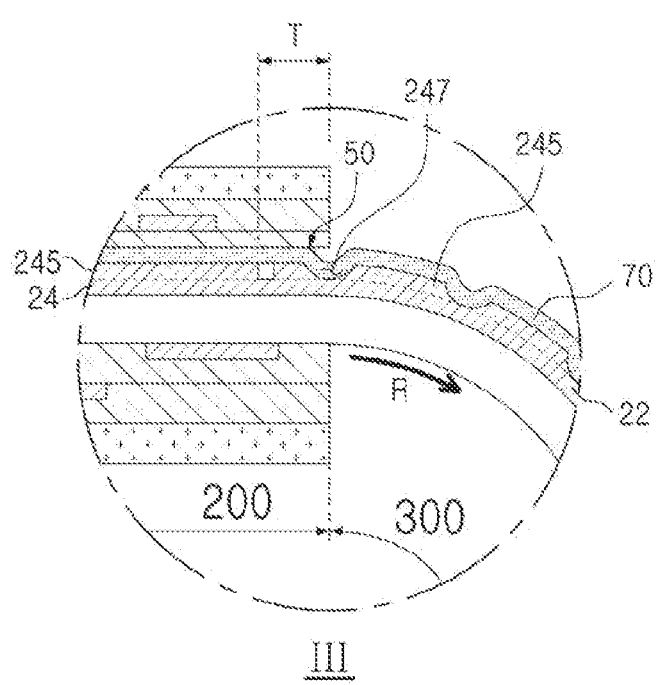
FIG. 7 is an enlarged schematic view illustrating portion III of FIG. 6.

FIG. 6 is a cross-sectional view of a circuit pattern of Example 3 of the flexible printed circuit board of FIG. 1, and FIG. 7 is an enlarged schematic view illustrating portion III of FIG. 6.

Referring to FIGS. 1, 6 and 7, the flexible printed circuit board 1 includes the first rigid area 200 and the flexible area 300, and the circuit pattern 22 of the flexible area 300 has a portion thinner than the circuit pattern 24 of the rigid area 200.

The portion in the circuit pattern 22 of the flexible area 300, thinner than the circuit pattern 24 of the rigid area 200, is a rounded groove 247.

In comparison to the circuit pattern 22 of the flexible area 300 of FIGS. 2 and 3, a thickness-reinforcing circuit pattern 245 is formed in an upper portion of the circuit pattern 22 of the flexible area 300 of the present exemplary embodiment such that an overall thickness of the circuit pattern in the flexible area 300 becomes similar to that of the circuit pattern 24 of the rigid area 200.

The thickness-reinforcing circuit pattern 245 of the flexible area 300 may be manufactured by selecting a rolled annealed copper foil relatively thicker than the circuit pattern 22 of the flexible area 300 of FIGS. 2 and 3 and etching to form the rounded grooves 247 at regular intervals.

When bending or folding the flexible printed circuit board 1, compressive force is generated inside the bending of the flexible printed circuit board 1, and tensile force is generated outwardly within the bended portion. A thickness difference at a stepped portion formed in the circuit pattern 22 of the flexible area 300 due to the rounded groove 247 may reduce the tensile force generated outwardly within the bended portion.

Alternately, the thickness may be increased by selecting a rolled annealed copper foil having a thickness not different from that of the circuit pattern 22 of the flexible area 300 of FIGS. 2 and 3 and forming the thickness-reinforcing circuit pattern 245 to be thicker than the circuit pattern 22 of the flexible area 300 on an upper portion of the rolled annealed copper foil to form an electrodeposited copper foil.

The thickness-reinforcing circuit pattern 245 of the flexible area 300 having the rounded grooves 247 may effectively reduce the tensile force generated outwardly within the bended portion by having a smaller average thickness than that of the thickness-reinforcing circuit pattern 245 of the rigid area 200. In addition, the coverlay film 70 of the flexible area 300 may be disposed at a lower level than the coverlay film 70 of the rigid area 200 according to the rounded groove 247 of the thickness-reinforcing circuit pattern 245.

The other descriptions of the exemplary embodiments of FIGS. 1 to 3 may also be applied to the present exemplary embodiment within a range which does not contradict each other.

Figure 8:
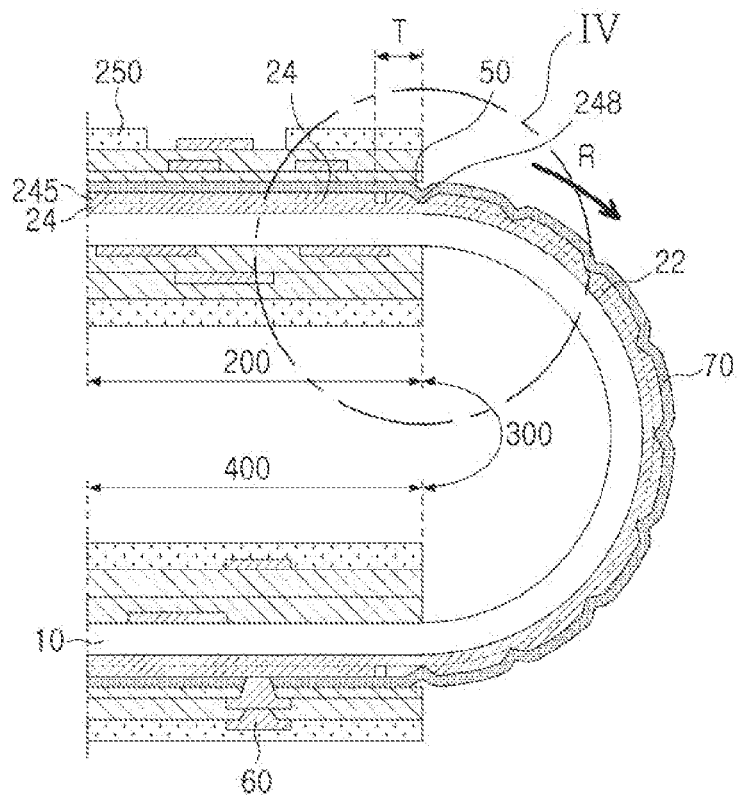
FIG. 8 is a cross-sectional view of a circuit pattern of Example 4 of the flexible printed circuit board of FIG. 1.
Figure 9:
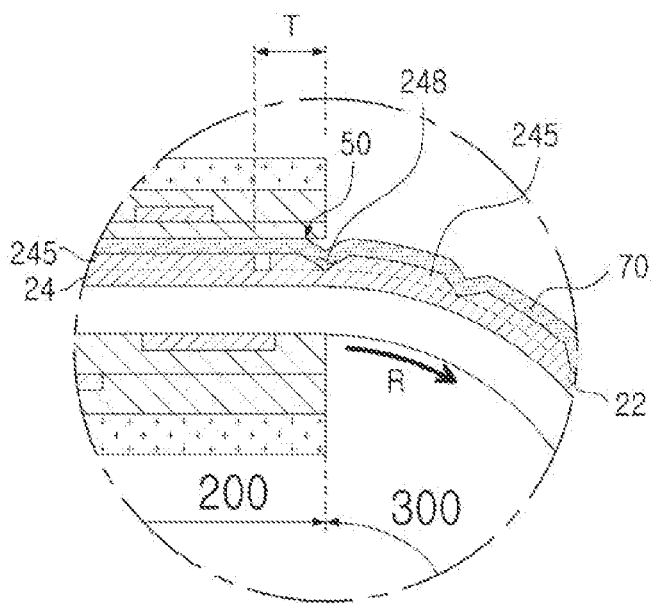
FIG. 9 is an enlarged schematic view illustrating portion IV of FIG. 8.

FIG. 8 is a cross-sectional view of a circuit pattern of Example 4 of the flexible printed circuit board of FIG. 1, and FIG. 9 is an enlarged schematic view illustrating portion IV of FIG. 8.

Referring to FIGS. 1, 8 and 9, the flexible printed circuit board 1 includes the first rigid area 200 and the flexible area 300, and the circuit pattern 22 of the flexible area 300 has a portion thinner than the circuit pattern 24 of the rigid area 200.

The portion in the circuit pattern 22 of the flexible area 300, thinner than the circuit pattern 24 of the rigid area 200, is a triangular groove 248.

In comparison to the circuit pattern 22 of the flexible area 300 of FIGS. 2 and 3, a thickness-reinforcing circuit pattern 245 is formed in an upper portion of the circuit pattern 22 of the flexible area 300 of the present exemplary embodiment such that an overall thickness of the circuit pattern in the flexible area 300 becomes similar to that of the circuit pattern 24 of the rigid area 200.

The thickness-reinforcing circuit pattern 245 of the flexible area 300 may be manufactured by selecting a rolled annealed copper foil relatively thicker than the circuit pattern 22 of the flexible area 300 of FIGS. 2 and 3 and etching to form the triangular groove 248 at regular intervals.

When bending or folding the flexible printed circuit board 1, compressive force is generated inwardly within the bended portion of the flexible printed circuit board 1, and tensile force is generated outwardly within the bended portion. A thickness difference at a stepped portion formed in the circuit pattern 22 of the flexible area 300 due to the triangular groove 248 may reduce the tensile force generated outwardly within the bended portion.

Alternately, the thickness may be increased by selecting a rolled annealed copper foil having a thickness not different from that of the circuit pattern 22 of the flexible area 300 of FIGS. 2 and 3 and forming the thickness-reinforcing circuit pattern 245 thicker than the circuit pattern 22 of the flexible area on an upper portion of the rolled annealed copper foil to form an electrodeposited copper foil.

The thickness-reinforcing circuit pattern 245 of the flexible area 300 having the triangular grooves 248 may effectively reduce the tensile force generated outwardly within the bended portion by having a smaller average thickness than that of the thickness-reinforcing circuit pattern 245 of the rigid area 200. In addition, the coverlay film 70 of the flexible area 300 may be disposed at a lower level than the coverlay film 70 of the rigid area 200 according to the triangular groove 248 of the thickness-reinforcing circuit pattern 245.

The other descriptions of the exemplary embodiments of FIGS. 1 to 3 may also be applied to the present exemplary embodiment within a range which does not contradict each other.

Referring again to FIGS. 1 to 9, the flexible printed circuit board 1 according to an exemplary embodiment of the present disclosure includes the rigid areas 200 and 400, the flexible area 300 and the coverlay film 70.

The rigid areas 200 and 400 include the first rigid area 200 and the second rigid area 400 with the flexible area 300 interposed therebetween, and the base film 10 and the circuit pattern 24 disposed on the base film 10.

The flexible area 300 has the circuit pattern 22 disposed on one outer surface in a direction in which the base film 10 bends.

The coverlay film 70 covers the circuit patterns 22 and 24 in the rigid area 200 and the flexible area 300.

As the circuit pattern 22 of the flexible area 300 has the portion thinner than the circuit pattern 24 of the rigid area 200, the tensile force generated outwardly within the bended portion of the flexible circuit board 1 may be distributed when bending or folding the flexible printed circuit board 1.

The circuit patterns 22 and 24 may include a rolled annealed copper foil. The circuit pattern 24 of the rigid area 200 may be plated with an electrodeposited copper foil to have a thickness-reinforcing circuit pattern 245 thicker than that of the circuit pattern 22 of the flexible area 300.

The thickness-reinforcing circuit pattern 245 may be formed in the upper portion of the circuit pattern 22 of the flexible area 300 to have a thickness similar to that of the circuit pattern 24 of the rigid area 200.

The height hC of the coverlay film of the flexible area 300 may be set to be lower than the height hR of the coverlay film of the rigid area 200 along the portion thinner than the circuit pattern 24 of the rigid area 200.

In the rigid area 200, a transition region T, to which the circuit pattern 22 of the flexible area 300 is connected, is formed, and a margin portion 50, in which a circuit pattern is formed to have substantially the same thickness tF as the circuit pattern 22 of the flexible area 300, may be provided in the transition region T.

The circuit pattern 22 of the flexible area 300 and the circuit pattern 24 of the margin portion is uniformly formed to be thinner than the circuit pattern 24 in the rigid area 200.

The thickness-reinforcing circuit pattern 245 is disposed on an upper surface of the circuit pattern 22 of the flexible area 300 and an upper surface of the circuit pattern 22 of the margin portion. In the thickness-reinforcing circuit pattern, at least one of the square groove 246, the triangular groove 248 or the rounded groove 247 may be formed. A shape of the groove is not particularly limited.

The end of the margin portion 50 is a boundary between the circuit pattern 24 of the rigid area 200 and the circuit pattern 22 of the flexible area 300 and may be a point at which the circuit pattern 22 of the flexible area 300 begins to bend.

Electronic Device

Figure 10:
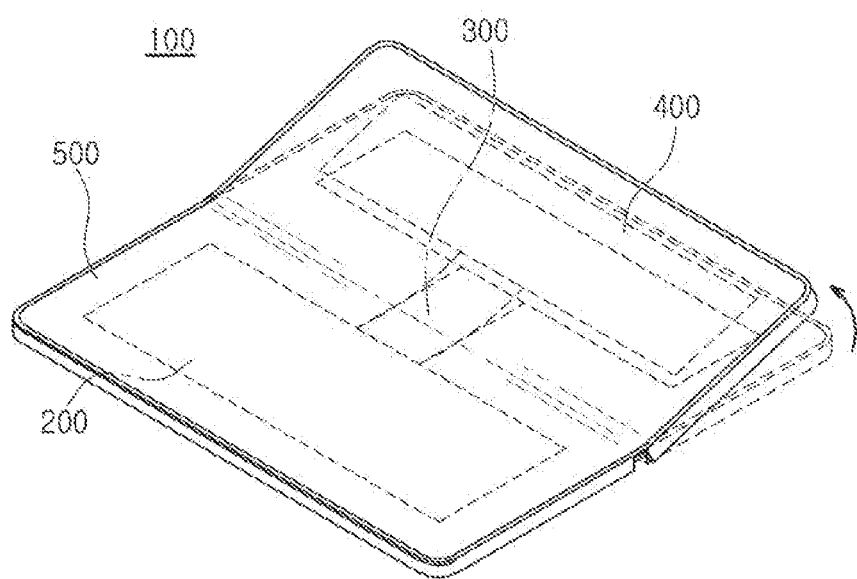
FIG. 10 is a schematic perspective view of a foldable terminal as an electronic device according to an exemplary embodiment in the present disclosure.

FIG. 10 is a schematic perspective view of a foldable terminal as an electronic device according to an exemplary embodiment in the present disclosure.

Referring to FIG. 10, an electronic device 100 according to an exemplary embodiment of the present disclosure may include a flexible printed circuit board 1 and a display module 500.

The flexible printed circuit board 1 includes a flexible area 300 and at least one of a first rigid area 200 or a second rigid area 400 connected to the flexible area 300.

The display module 500 may be bent, folded, or rolled, and accordingly, the flexible area 300 may be adjusted to have a required length.

Meanwhile, the display module 500 may be electrically connected to at least one of the first rigid area 200 or the second rigid area 400.

The flexible printed circuit board 1 according to any of the above-described exemplary embodiments may be applied to the electronic device 100 according to the present exemplary embodiment.

As set forth above, according to the exemplary embodiments of the present disclosure, the flexible printed circuit board has improved reliability in bending and folding even though repeated external forces are applied to the printed circuit board in a situation in which the thin and light conductive wires are used.

In addition, the flexible printed circuit board is capable of simultaneously having improved folding reliability in a flexible area and improved wiring reliability in a rigid area by forming a conductive pattern in the flexible area of the flexible circuit board to have a different thickness from that in the rigid area.

According to the exemplary embodiments of the present disclosure, an electronic device including the flexible printed circuit board has improved durability due to folding.

While exemplary embodiments have been shown and described above, it will be apparent to those skilled in the art that modifications and variations could be made without departing from the scope of the present invention as defined by the appended claims.

What is claimed is:

1. A flexible printed circuit board, comprising:
a base film;
a circuit pattern disposed on one surface of the base film; and
a coverlay film covering the circuit pattern,
wherein the base film is divided into a flexible area and a rigid area,
the circuit pattern of the flexible area comprises a portion thinner than a portion of the circuit pattern of the rigid area,
the circuit pattern of the flexible area includes a plurality of grooves spaced apart from one another at regular intervals, such that the coverlay film disposed on the circuit pattern of the flexible area has a plurality of stepped portions on one surface of the coverlay film, and
one of the plurality of grooves is formed in only a part of the circuit pattern of the flexible area in a thickness direction of the circuit pattern.

2. The flexible printed circuit board of claim 1, wherein the circuit pattern includes a rolled annealed copper foil.

3. The flexible printed circuit board of claim 2, wherein the circuit pattern of the rigid area includes a thickness-reinforcing circuit pattern, which is an electrodeposited copper foil.

4. The flexible printed circuit board of claim 1, wherein the coverlay film of the flexible area is disposed at a level lower than a level of a portion of the coverlay film of the rigid area.

5. The flexible printed circuit board of claim 1, wherein the rigid area includes a transition region, in which the circuit pattern of the flexible area is connected to the circuit pattern of the rigid area, and
wherein a circuit pattern of the transition region having a thickness substantially the same as a thickness of the circuit pattern of the flexible area is a margin portion.

6. The flexible printed circuit board of claim 5, wherein each of the thickness of the circuit pattern of the flexible area and the thickness of the circuit pattern of the margin portion is smaller than a thickness of the portion of the circuit pattern of the rigid area.

7. The flexible printed circuit board of claim 5, wherein a thickness-reinforcing circuit pattern is disposed on an upper surface of the circuit pattern of the flexible area and an upper surface of the circuit pattern of the margin portion, and
wherein the thickness-reinforcing circuit pattern includes at least one of a square groove, a triangular groove or a rounded groove.

8. The flexible printed circuit board of claim 5, wherein an end of the margin portion is a boundary between the circuit pattern of the rigid area and the circuit pattern of the flexible area, and
wherein the circuit pattern of the flexible area begins to bend at the end of the margin portion.

9. A flexible printed circuit board, comprising:
a rigid area comprising a first portion of a base film and a first portion of a circuit pattern disposed on the base film;
a flexible area comprising a second portion of the base film, which is bendable, and a second portion of the circuit pattern disposed on one outer surface of the second portion of the base film; and
a coverlay film covering the first and second portions of the circuit pattern of the rigid area and the flexible area,
wherein the second portion of the circuit pattern of the flexible area has a portion thinner than a portion of the first portion of the circuit pattern of the rigid area,
the second portion of the circuit pattern of the flexible area includes a plurality of grooves spaced apart from one another at regular intervals, such that the coverlay film disposed on the second portion of the circuit pattern of the flexible area has a plurality of stepped portions on one outer surface of the coverlay film, and
the plurality of stepped portions on the one outer surface of the coverlay film are respectively arranged in the plurality of grooves of the circuit pattern of the flexible area.

10. The flexible printed circuit board of claim 9, wherein the first and second portions of the circuit pattern include a rolled annealed copper foil.

11. The flexible printed circuit board of claim 10, wherein the first portion of the circuit pattern of the rigid area includes a thickness-reinforcing circuit pattern, which is an electrodeposited copper foil.

12. The flexible printed circuit board of claim 9, wherein the coverlay film of the flexible area is disposed at a level lower than a level of a portion of the coverlay film of the rigid area.

13. The flexible printed circuit board of claim 9, wherein the rigid area includes a transition region, in which the first and second portions of the circuit pattern of the rigid area and the flexible area are connected to each other, and
wherein the transition region includes a margin portion of the circuit pattern having a thickness substantially the same as a thickness of the second portion of the circuit pattern of the flexible area.

14. The flexible printed circuit board of claim 13, wherein each of the thickness of the second portion of the circuit pattern of the flexible area and the thickness of the margin portion of the circuit pattern of the transition region is smaller than a thickness of the portion of the first portion of the circuit pattern of the rigid area.

15. The flexible printed circuit board of claim 13, wherein a thickness-reinforcing circuit pattern is disposed on an upper surface of the second portion of the circuit pattern of the flexible area and an upper surface of the margin portion of the circuit pattern of the transition region, and
wherein the thickness-reinforcing circuit pattern includes at least one of a square groove, a triangular groove or a rounded groove.

16. The flexible printed circuit board of claim 13, wherein an end of the margin portion of the circuit pattern of the transition region is a boundary between the first portion of the circuit pattern of the rigid area and the second portion of the circuit pattern of the flexible area, and
wherein the second portion of the circuit pattern of the flexible area begins to bend at the end of the margin portion of the circuit pattern of the transition region.

17. The flexible printed circuit board of claim 9, wherein one of the plurality of grooves is formed in only a part of the circuit pattern of the flexible area in a thickness direction of the circuit pattern.

18. An electronic device, comprising:
a flexible printed circuit board comprising a flexible area and at least one of a first rigid area or a second rigid area connected to the flexible area; and
a display module electrically connected to at least one of the first rigid area or the second rigid area, wherein the flexible printed circuit board comprises:
a base film;
a circuit pattern disposed on one upper surface of the base film; and
a coverlay film covering the circuit pattern,
wherein the base film is divided into the flexible area and the at least one of the first rigid area or the second rigid area,
the circuit pattern of the flexible area comprises a portion thinner than a portion of the circuit pattern of the at least one of the first rigid area or the second rigid area, and
the circuit pattern of the flexible area includes a plurality of grooves spaced apart from one another at regular intervals, such that the coverlay film disposed on the circuit pattern of the flexible area has a plurality of stepped portions on one surface of the coverlay film.

19. The electronic device of claim 18, wherein the circuit pattern of the flexible area comprises a rolled annealed copper foil and an electrodeposited copper foil disposed on an upper surface of the rolled annealed copper foil, and
the plurality of grooves are arranged on an upper surface of the electrodeposited copper foil.

20. The electronic device of claim 18, wherein an average thickness of the circuit pattern of the flexible area is less than an average thickness of the portion of the circuit pattern of the at least one of the first rigid area or the second rigid area.

\* \* \* \* \*